United States Patent [19]

Lee et al.

[11] 4,145,617
[45] Mar. 20, 1979

[54] CONTROL CIRCUIT FOR PROVIDING TIME SELECTED APPLICATION OF A.C. POWER

[75] Inventors: John H. Lee, North Oaks; Peter A. Lind, Afton, both of Minn.

[73] Assignee: Minnesota Mining and Manufacturing Company, St. Paul, Minn.

[21] Appl. No.: 818,652

[22] Filed: Jul. 25, 1977

[51] Int. Cl.² .................................................. H01H 43/00
[52] U.S. Cl. .................................... 307/43; 58/23 R; 307/66; 307/141; 340/124
[58] Field of Search .................. 307/141, 141.4, 141.8, 307/66, 43, 11; 331/21; 340/124; 116/63 R; 58/23 R, 23 BA

[56] References Cited

U.S. PATENT DOCUMENTS

| 3,394,674 | 7/1968 | Downing | 116/63 R |
| 3,400,366 | 9/1968 | Downing | 340/124 |
| 3,456,123 | 7/1969 | Pihl | 307/141 |
| 3,733,810 | 5/1973 | Girard | 58/4 A |
| 4,020,358 | 4/1977 | Wyland | 307/141 |
| 4,023,343 | 5/1977 | Martinet | 58/23 R |
| 4,040,247 | 8/1977 | Haydon | 58/23 BA |

Primary Examiner—Gene Z. Rubinson
Assistant Examiner—Morris Ginsburg
Attorney, Agent, or Firm—Cruzan Alexander; Donald M. Sell; Robert L. Marben

[57] ABSTRACT

A solid-state programmable control circuit provides multiple time selected application of A.C. power to one or more utilization circuits or devices. The control circuit uses a crystal controlled time base generator which is synchronized to commercial A.C. power. Stand-by battery power is provided to maintain timing when A.C. power is lost. A time display plug-in module is used with the circuit for setting the time for the control circuit. Programming can be done at a point remote from the control circuit.

9 Claims, 4 Drawing Figures

CONTROL CIRCUIT FOR PROVIDING TIME SELECTED APPLICATION OF A.C. POWER

BACKGROUND OF THE INVENTION

1. Field of the Invention

This invention relates to control circuits for providing time selected application of A.C. power to one or more utilization circuits or devices and, more particularly, to a control circuit for providing time selected operation of traffic control signs of the type which operate to display a traffic directory message and, upon subsequent actuation, operate to remove the message or display a different message.

2. Description of the Prior Art

Traffic signs are known which are particularly adapted for period traffic control. A sign of this type is disclosed in U.S. Pat. Nos. 3,394,674 and 3,400,366 to Donald M. Downing. The sign is driven by motors and unfolds to display a traffic directory message and upon subsequent actuation folds to conceal the message or display a different message. The sign, for example, may be used at intersections to present a "no left turn" message during peak traffic periods of each day with such message otherwise obscured. A sign of this type is also useful to present a desired speed limit or other message during certain periods of the day in the vicinity of a school. During periods when the speed limit is not enforced, the message is obscured.

Electro-mechanical timers have been used to provide the times required for actuation of signs of this type. Such electro-mechanical timers, however, are awkward to set for particular actuating times, are limited with respect to the length of time periods between actuations and, in the event of the power failure, must usually be reset after power is restored so as to operate at the proper time.

SUMMARY OF THE INVENTION

The control circuit of this invention overcomes the disadvantages mentioned with respect to electro-mechanical timers in that a solid-state, 7-day, 24-hour clock is provided which permits easy and accurate selection of desired time periods which are well within the limits desired for timed operations, with stand-by battery operation provided for the timing function required for the control circuit which eliminates the need for resetting the time for the control circuit following a power failure. In addition, programming circuitry is provided for the control circuit which can be removed as a separate module making it possible to establish the desired time program for the circuit at a site that is remote to the control circuit location. The control circuit of this invention also provides for a visual time display circuit which can be connected to the control circuit for providing a display of the time presented by the control circuit to provide a means for setting the timing circuit of the control circuit so that the operation of the control circuit will be in accordance with the current time. The timing provided by the control circuit of the present invention is based on a crystal controlled oscillator, the output of which is synchronized to the frequency of the A.C. power that is used with the control circuit. The circuitry used to provide the synchronizing pulses has a significant noise immunity characteristic. Any timing error that may be introduced due to ambient temperature changes affecting the operation of the crystal is then limited to those periods when the A.C. power has been interrupted.

In addition, signs of the type described using electro-mechanical timers are not known to provide for the operation of flashing beacons under the control of the timing provided by the electro-mechanical timers. The control circuit of this invention in addition to controlling the operation of traffic signs adapted for period traffic control timing can also provide the timing for the rapid on-off operation of beacons which is coordinated with the operation of the sign.

BRIEF DESCRIPTION OF THE DRAWINGS

For a more complete understanding of the invention, reference should be made to the accompanying drawings, wherein.

DETAILED DESCRIPTION

Figure 1:
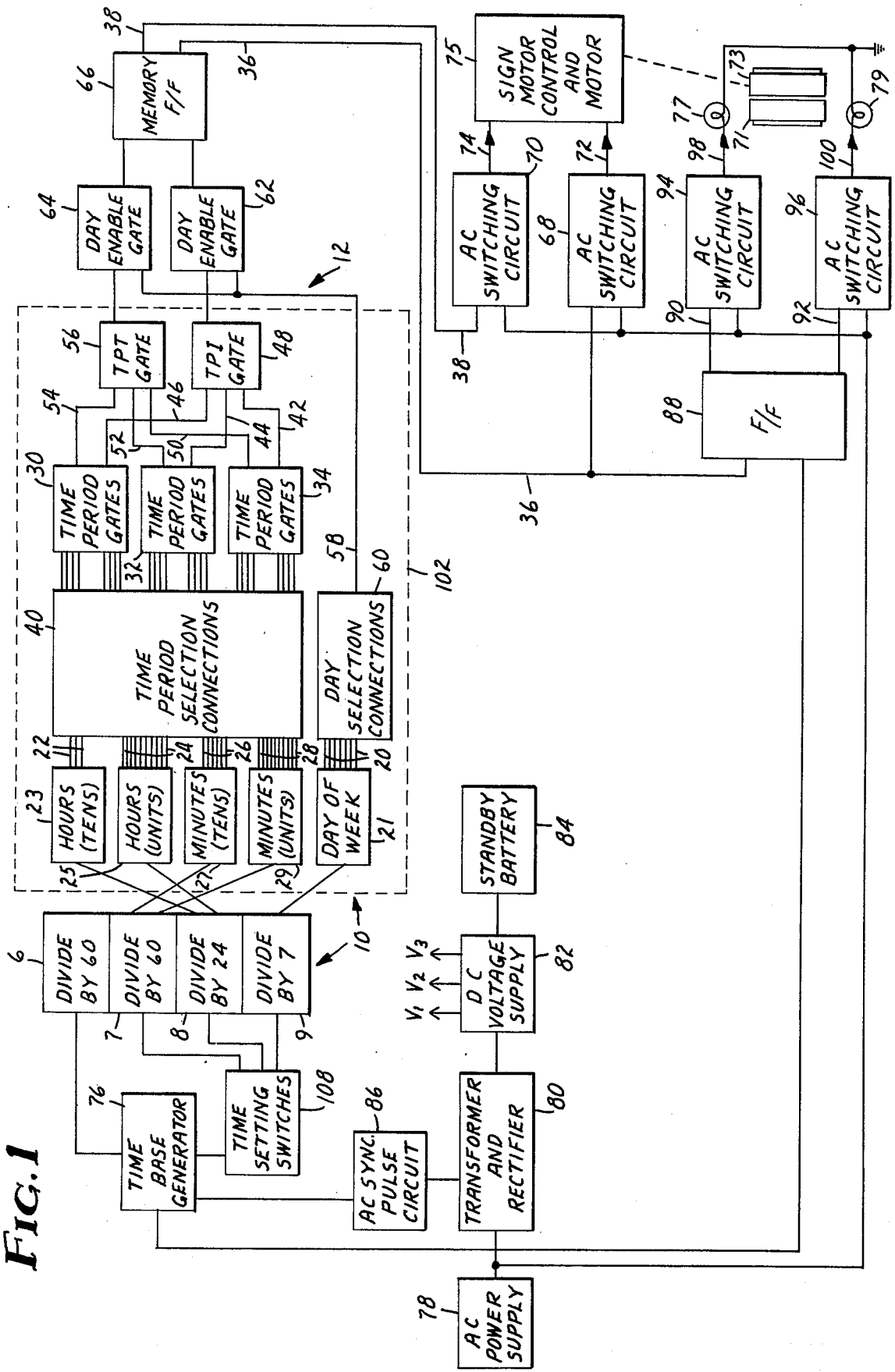
FIG. 1 is a block diagram of the control circuit of this invention.

Referring to FIG. 1 of the drawing, the control circuit of this invention includes a solid-state, 7-day, 24-hour clock 10 which provides electrical outputs for the day of the week (1-7) at 20, TENS of hours (0-2) at 22, units of hours (0-9) at 24, TENS of minutes (0-5) at 26, and units of minutes (0-9) at 28. Programmable control circuitry indicated generally at 12 is connected to the outputs of the clock 10 and includes time period gates 30, 32 and 34. The time period gates have their inputs connected to selected ones of the time of day outputs of the clock 10 for establishing the time of day time periods at which it is desired that control signals be presented at a control signal output 36 of the programmable control circuitry. A second control signal output 38 is also available at which control signals, opposite to those present at the control signal output 36, are presented. Since the connections made between the time of day outputs of clock 10 and the time period gates are selective in nature, the connections are represented by the block 40. While time period gates are indicated which will permit the selection of up to three time periods, more can be utilized. The number of time period gates provided is determined by the number of time periods that may be needed. The outputs 42, 44 and 46, one from each of the time period gates, provide time period initiating outputs and are applied to a time period initiating (TPI) gate 48. Similarly, outputs 50, 52 and 54, one from each of the time period gates, provide time period terminating signals and are applied to a time period terminating (TPT) gate 56. The output of the time period initiating gate 48 provides a signal for one minute at the beginning of each selected time period, while the output of the time period terminating gate 56 provides a signal for one minute at the end of each selected time period.

In addition to providing for programming of the control circuit for operation during selected time periods of the day, provision is made in the programmable circuitry 12 for programming the operation of the control circuit so the selected time of day time periods are effective only during selected days of the week. The day of week outputs 20 provide for the days of the week selections desired. Each day output that is selected from the day of week outputs 20 is connected to a day output 58. The day selection connections are indicated by the block 60. The day output 58 is connected to one input of a day enable gate 62 of the programmable circuitry 12 which has another input connected to the output of the time period initiating gate 48. The day output 58 is similarly connected to provide one input to a day enable gate 64 of the programmable circuitry 12 which has a second input connected to the output of the time period terminating gate 56. The outputs of the day enable gates 62 and 64 are applied to separate inputs of a memory flip-flop circuit 66 of the programmable circuitry 12. The outputs of the memory flip-flop circuit 66 provide the control signal outputs 36 and 38. Since an output from either of the day enable gates 62 and 64 remains for only one minute, the memory flip-flop 66 is needed. Using a bistable type flip-flop circuit for memory 66, an output is provided in response to a time selected input signal to one of the inputs of the flip-flop which remains until the other input receives a time selected input signal.

The control signal outputs 36 and 38 are connected to A.C. switching circuits 68 and 70, respectively. The signal established at the signal control output 36 in response to the receipt of a time period initiating signal at one input to the gate 48 together with a day indicating signal on the day output 58 serves to control the operation of the switching circuit 68 to cause A.C. power to be presented at its output 72. When such a signal is present at the control signal output 36, the memory flip-flop 66 causes the control signal output 38 to present an output which is not effective to activate the switching circuit 70. Upon receipt by gate 56 of the time period terminating signal for the time period that was initiated at the gate 48, the memory flip-flop 66 is operated to cause the control signal output 38 to present a signal which is effective to activate the switching circuit 70 to cause A.C. power to be presented at its output 74. The presence of such a signal at the control signal output 38 is effective to cause the output for the control signal output 36 to change so as to terminate the activation of the switching circuit 68.

The control circuit is normally powered from an A.C. power source indicated by the block 78, which applies A.C. power to a transformer and rectifier circuit 80. A D.C. voltage supply circuit 82 is connected to the transformer and rectifier circuit 80 and is designed to provide the necessary D.C. voltage levels at $V_1$, $V_2$ and $V_3$ for operating the control circuit.

The control circuit of the invention also includes a time base generator 76 which provides timing pulses for the clock 10 at a frequency of 1 Hz. The time base generator 76 includes a crystal controlled oscillator. Since the ambient conditions to which the time base generator 76 can be expected to be subjected will affect the frequency at which the crystal operates, substantial timing errors could develop over a long period of operation. This problem is avoided by having the operation of the time base generator 76 synchronized to the A.C. power. An A.C. synchronizing pulse circuit 86, which is connected to the A.C. power via the transformer and rectifier circuit 80, provides synchronizing pulses, one for each cycle of A.C., which are applied to the time base generator 76. A specific circuit for use as circuit 86 will be described later. Such circuit is preferred since it has a significant noise immunity characteristic. Since the A.C. power can be expected to be interrupted from time to time for short periods of time, it is desirable that the clock 10 continue to operate so that the clock will not require resetting each time there is a power interruption. The D.C. voltage supply circuit 82 provided at $V_2$ is used for operating the time base generator 76, the clock 10, and the programming circuit 12. A stand-by battery 84 is connected to the D.C. voltage supply 82 in a manner well known in the art so that it automatically provides the necessary D.C. voltage at $V_2$ when there is an interruption of the A.C. power to the control circuit so that proper timing continues to be provided.

The control circuit that has been described can be used to provide the time application of A.C. power to traffic signs of the type disclosed in U.S. Pat. Nos. 3,394,674 and 3,400,366 to Donald M. Downing. A sign of this general type is schemtically shown with the control circuit of this invention in FIG. 1. The sign is shown with hinged panels 71 and 73 which are driven to a closed or open position by a motor control and motor 75 which receives A.C. power at one control input to cause the motor to operate to move the panels to an open position to display a traffic directory message and receives A.C. power at a second control input to move the panels to a closed position to cover the traffic directory message (not shown). In the case of the control circuit that has been described, the A.C. power output provided by the output 72 of switching circuit 68 is connected to the motor control 75 for the sign motor to cause the panels of the sign to be moved to an open position at the start of each selected time period, while the A.C. power output 74 of the switching circuit 70 is applied to the motor control to cause the panels to be moved to the closed position at the end of each selected time period.

Referring to FIG. 1, a flip-flop circuit 88 is shown which is used to control two A.C. switching circuits 94 and 96 connected to beacon lights 77 and 79, respectively. Circuit 88 has one input connected to the control output 36 so as to enable the flip-flop 88 when the memory flip-flop 66 has been operated in response to a time period initiating signal received from the day enable gate 62. The flip-flop circuit 88 is also shown connected to the time base generator 76 from which it receives an alternating signal at a frequency of 1 Hz. When an enabling signal is received from the control output 36 and alternating signals are received from the time base generator 76, the flip-flop circuit 88 alternately presents control signals at its outputs 90 and 92 at the 1 Hz frequency. A.C. power is presented at the output 98 of the switching circuit 94 for the time that a control signal is presented at the output 90 of flip-flop 88 with A.C. power presented at the output 100 of the switching circuit 96 when a signal is presented at the output 92 of flip-flop 88. This arrangement allows the beacon lights 98 and 100 to be used for operation on conjunction with a sign of the type disclosed in U.S. Pat. No. 3,394,674 to Donald M. Downing. When beacon lights are used, they may be spaced apart as shown in FIG. 1 with one beacon light 77 connected to the output 98 of switching circuit 94 and another beacon light 79 connected to the output 100 of switching circuit 96. When so connected, the beacon lights are alternately energized at a frequency of 1 Hz during the time periods when the panels for the sign are moved to the open position.

It should be noted that although the switching circuits 68, 70, 94 and 96 are shown connected only to the A.C. power source 78, they also receive the D.C. voltage $V_3$ from the power supply 82.

Referring to FIG. 1, a portion of the programming circuitry 12 is shown enclosed by a dotted line 102. Such portion of the programming circuitry 12 comprises a plug-in module which, when removed from the control circuit, permits the connections 40 for the time period selections and connections 60 for the day selections to be made at a location other than the place where the control circuitry is installed.

In order that the control circuit of FIG. 1 can be used, it is necessary that provision be made for setting the clock 10 to the correct time of day and day of week. Before considering how this is done, the structure for clock 10 will be considered. The four blocks 6–9, inclusive, are four divider circuits which are connected in cascade to provide the outputs to be described. The divider circuit represented by block 6 receives timing pulses from the time base generator 76 at a frequency of 1 Hz. The pulses received are divided by 60 so as to provide a timing pulse to the divider circuit 7 once every minute. The divider circuit 7 is connected to provide a binary coded decimal (BCD) output count of the pulses it receives at one minute intervals and also divides the pulses it receives by 60 so as to provide a pulse to the divider circuit 8 at a one per hour rate. The divider circuit represented by block 8 is connected to provide a BCD output count of the timing pulses it receives from the divider circuit 7 at the one per hour rate. It is connected to be reset every 24 hours and is also connected to divide the pulses it receives by 24 to provide a pulse to the divider circuit 9 every 24 hours. The divider circuit 9 is connected to provide a BCD output count of the pulses received from the divider circuit 8 at the one pulse per 24-hour rate. The divider circuit 9 divides the pulses it receives from divider circuit 8 by seven to provide a pulse that is used to reset the divider circuit every seven days. The clock 10 also includes five BCD to decimal decoders 21, 23, 25, 27 and 29. The decoder 23 is connected to the BCD output from the divider circuit 8 so as to provide the TENS place for the hours of the 24-hour clock time. The decoder 25 is also connected to the divider circuit 8 for receiving the BCD output so as to provide the units of hours place for the 24-hour clock time. Similarly, decoder 27 receives its input from the BCD output of the divider circuit 7 so as to provide the TENS place for the minutes of the time provided by the clock, while the decoder 29 is connected to the BCD output of the divider circuit 7 so as to provide the units of the minutes place for the clock time. The decoder 21 is connected to the BCD output of the divider circuit 7 so as to provide the day of week output for the clock time.

Figure 2:
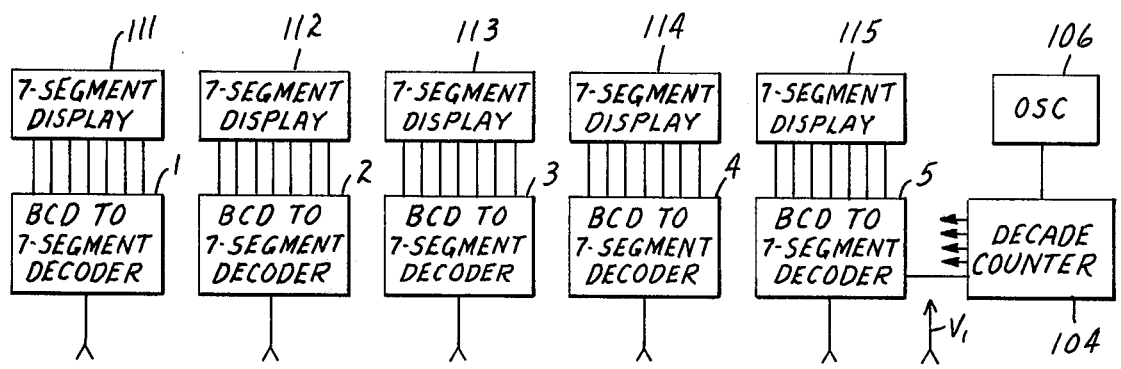
FIG. 2 is a block diagram of a visual time display module used when setting the clock used in the control circuit of FIG. 1.

A time display plug-in module shown in FIG. 2 is provided for use in setting the clock 10 to the correct time of day and day of week. The time display plug-in module includes five BCD to 7-segment decoders 1–5, inclusive, each of which are connected to printed circuit board edge connectors for connection of the inputs for the decoders 1–5 to the BCD outputs provided by the clock from the divider circuits 7, 8 and 9. The time display plug-in module of FIG. 2 is connected to the control circuit after the plug-in module portion 102 of the programming circuit 12 is removed from the programming circuit 12. Five 7-segment displays 111-115, inclusive, which can be of the light emitting diode (LED) type, are provided, one for each of the BCD to 7-segment decoders 1–5. The time display plug-in module also includes a decade counter 104 and an oscillator 106 connected to drive the decade counter. An output from the decade counter is provided for each of the BCD to 7-segment decoders 1–5 for sequentially unblanking the decoders by pulses provided by the oscillator and decade counter. In this manner, each digit provided by the LED displays is not on continuously, but is sequentially unblanked by the pulses thereby reducing the power requirements and yet providing a digit output that is readily observable. In addition to the connections made to the outputs from the divider circuits 7–9, inclusive, the time display plug-in module also makes connection for receiving the voltage provided at the $V_1$ of the D.C. voltage supply 82 which is only used to operate the circuit components of the time display module.

Referring to FIG. 1, time setting switches 108, which include one for minutes, one for hours, and one for days, are connected between the output of the A.C. synchronizing pulse circuit 86 and the clock 10. One time switch of the time setting switches 108 is connected to the divider circuit 7 (minutes), another of the switches is connected to the divider circuit 8 (hours) with the third time switch connected to the divider circuit 9 (days). With the program plug-in module portion 102 of FIG. 1 removed from the programming circuitry 12 and the time display plug-in module of FIG. 2 connected by its edge connectors to the outputs of the divider circuits 7, 8 and 9 of clock 10, an operator need only depress the time setting switch connected to the divider circuit 7 (minutes) to provide a change in the minutes displays 113 and 114. Each 1 Hz pulse that is received from the time base generator 76 causes a change of one minute to take place. Once the numbers for the desired minutes have appeared on the displays, 113 and 114, the time setting switch for the divider circuit 7 (minutes) is released. The time setting switch connected to the divider circuit 8 (hours) is then operated to cause the displays 111 and 112 for TENS of hours and units of hours, respectively, to change at a 1 Hz rate. When the proper hour for a 24-hour clock appears on the displays 111 and 112, the time setting switch connected to the divider circuit 8 (hours) is released. The required day of the week as indicated by display 111 is similarly set by operator controlled operation of the time setting switch connected to the divider circuit 9 (days). Once the clock 10 is set for the proper time of day and day of the week, the display module is then removed from the printed circuit board for the control circuit of FIG. 1 and the plug-in module 102 of the programmable circuitry 12, which has been programmed for the desired time periods for selected days, is again inserted for connection in the printed circuit board for the control circuit.

Figure 3:
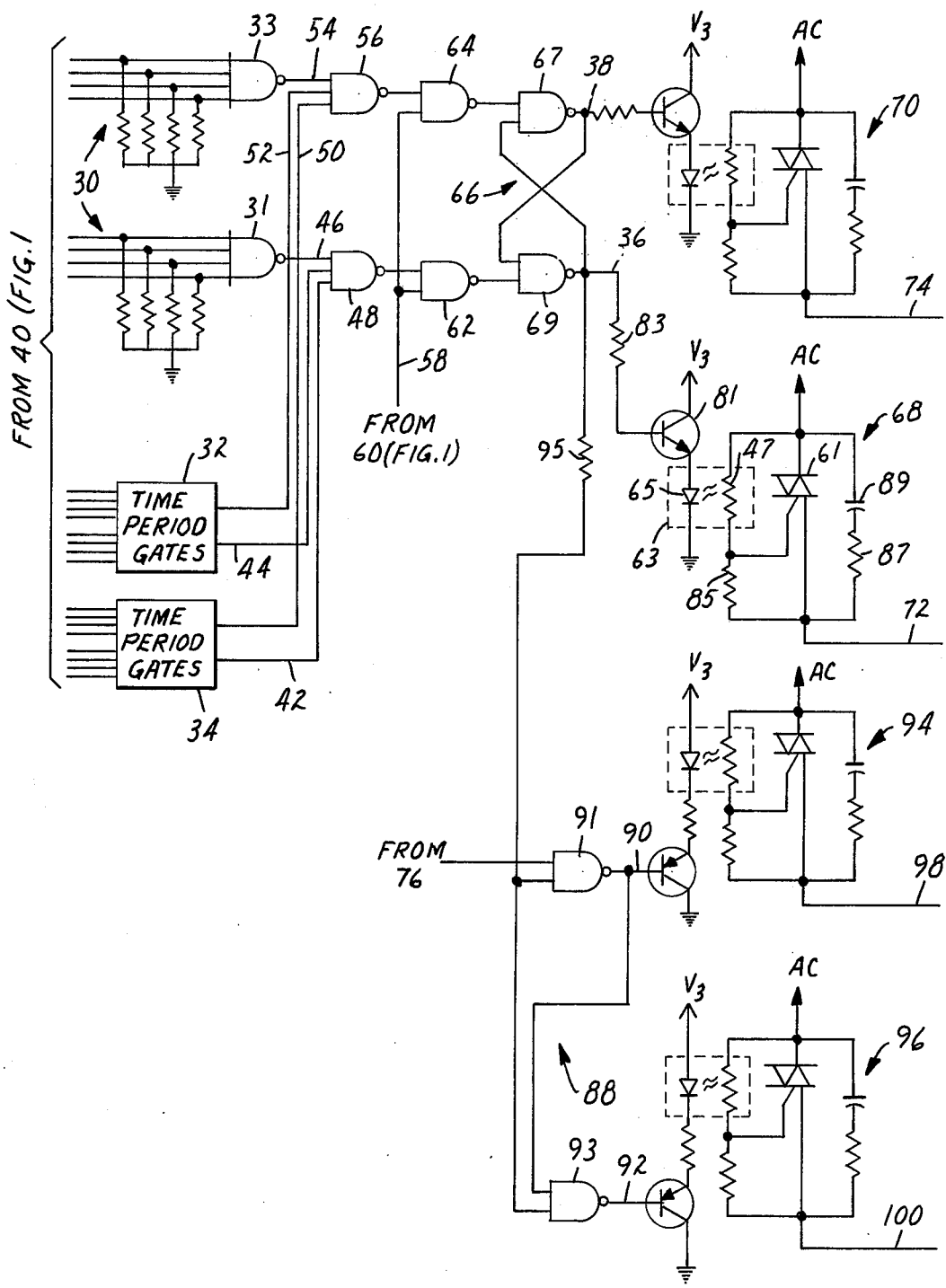
FIG. 3 is a showing of exemplary circuits for portions of the control circuit of FIG. 1.

Exemplary circuits for several of the circuit portions of the programmable circuitry 12 as well as the A.C. switching circuits 68, 70, 94 and 96 plus the flip-flop circuit 88 are shown in FIG. 3. Two NAND gates 31 and 33 provide the time period gate 30. Each of the NAND gates has four inputs. The inputs to NAND gate 31 connect with selected time of day outputs 22, 24, 26 and 28 of clock 10 as determined by the selected connections 40 (FIG. 1) which are made when programming the programmable circuitry 12 to establish the initiating time for a desired time period. For example, if the initiating time were 0840 for a programmed time period, one input for NAND gate 31 would connect with the 0 output of the outputs 22 of decoder 23, another input would connect with the 8 output of the outputs 24 of decoder 25, the third input would connect with the 4 output of the outputs 26 of decoder 27, and the last input for NAND gate 31 would connect with the 0 output of the outputs 28 of decoder 29. In addition, each input of NAND gate 31 is connected to ground via separate resistors. Prior to the time that the programmed time, 0840, is presented by the clock 10, all inputs to NAND gate 31 are a logical 0 so a logical 1 signal is presented at the output of NAND gate 31, which output changes to a logical 0 signal upon the clock 10 presenting the programmed time 0840, since all inputs to gate 31 are then a logical 1. This logical 0 signal will remain for one minute since at time 0841, one of the inputs to gate 31 will then be a logical 0. The NAND gate 33 has its inputs connected via the selected connections 40 to the time indicating outputs 22, 24, 26 and 28 of the clock 10 corresponding to the selected terminating time for the time period which, it was indicated, was selected to be initiated at 0840. Assuming the terminating time to be 0900, the NAND gate 33 provides a logical 1 signal output until the clock 10 presents the programmed time 0900, when its output changes to a logical 0 signal for a period of one minute. The time period gates 32 and 34 have NAND gates similar to the NAND gates 31 and 33 provided for the time period gate 30 allowing two other time periods to be selected.

A NAND gate having a sufficient number of inputs to accommodate the time period initiating outputs from the time period gates is used as the time period initiating gate 48. A similar NAND gate is usable as the time period terminating gate 56. In the case of the NAND gate 48, the time period initiating outputs 42, 44 and 46 from the time period gates will all normally be presenting a logical 1 signal to the NAND gate inputs causing the output of the NAND gate 48 to be a logical 0 signal. When a time period initiating signal is received from the clock 10 for any of the time period gates 30, 32 or 34, the NAND gate 48 will receive a logical 0 signal for one minute at one of its inputs causing its output to provide a logical 1 signal for such time. Similarly, when the clock 10 presents a time period terminating signal for one of the time period gates 30, 32 and 34, the NAND gate 56 will receive a logical 0 signal for a period of one minute causing the output of the NAND gate 56 to present a logical 1 signal for such time.

As shown in FIG. 3, a 2-input NAND gate can be used for each of the day enable gates 62 and 64. One input for each of the NAND gates 62 and 64 is connected to the conductor 58 from the day selection connections 60 of the programmable circuitry 12, while NAND gate 62 has its other connected to the output of the time period initiating NAND gate 48 with the NAND gate 64 having its other output connected to the output of the time period terminating NAND gate 56. With this arrangement, the time period initiating signals from NAND gate 48 and time period terminating signals from NAND gate 56 that may be presented during each 24-hour period will be reflected as logical 0 signals at the output of NAND gates 62 and 64, respectively, provided the day selection connections 60 of the programmable circuitry are connected to provide a logical 1 signal from the outputs 20 of the decoder 21 to connector 58 for a given 24-hour period.

The memory flip-flop 66 of the programmable circuitry 12 includes NAND gates 67 and 69 connected to provide a bistable flip-flop. NAND gate 67 has one input connected to the output of NAND gate 64 and another input connected to the output of NAND gate 69. NAND gate 69 has one input connected to the output of NAND gate 62 and another input connected to the output of NAND gate 67. The control signal outputs 36 and 38 for the programmable circuit 12 are provided by the outputs of NAND gates 69 and 67, respectively. Assuming the clock 10 is not providing a time period initiating time nor a time period terminating time, the outputs from both gates 62 and 64 will then be a logical 1. The flip-flop circuit 66 can only present a logical 1 signal at one of its outputs while a logical 0 signal is presented at its other output. If it is assumed control signal output 38 is presenting a logical 1 signal, the output for the control signal output 36 is then a logical 0 signal. If a time period initiating signal, a logical 1, is then presented at the output of NAND gate 48 and a logical 1 signal is present at the conductor 58, the output of NAND gate 62 will then be a logical 0 signal causing the output 36 of the NAND gate 69 to present a logical 1 signal which, with the logical 1 signal that is present from the NAND gate 64, causes the output 38 of the NAND gate 67 to present a logical 0 signal. The two input signals to the NAND gate 69 are then logical 0 signals, so the output of the NAND gate 69 remains as a logical 1 signal. After one minute, the time period initiating signal is removed causing the signal from the NAND gate 62 to then be a logical 1 signal. The output of NAND gate 69 continues to be a logical 1 signal. The clock 10 continues to operate until it causes a time period terminating signal, a logical 1, to be presented by NAND gate 56 causing the NAND gate 64 to present a logical 0 signal to the NAND gate 67 which, with the logical 1 signal from the output of NAND gate 69, causes the output of NAND gate 67 to change from a logical 0 signal to a logical 1 signal. The NAND gate 69 then has logical 1 signals at both of its inputs causing its output to change from a logical 1 to a logical 0. After one minute, the output of the gate 64 again presents a logical 1 signal to the NAND gate 67 which, with the logical 0 signal presented at its other input, causes the output of the NAND gate 67 to continue as a logical 1 signal. The clock 10 will then cause another time period initiating signal to appear at the output of NAND gate 48 causing the control signal output 36 to present a logical 1 signal and causing the control signal output 38 to present a logical 0 signal. The signal that is presented at the control signal outputs 36 and 38 will then be reversed when the next time period terminating signal is reached by the clock 10.

The flip-flop circuit 88 is provided by the two NAND gates 91 and 93, each of which have one input connected to the control signal output 36 via a resistor 95. The other input for NAND gate 91 is connected to the time base generator 76 which provides an alternating signal at a frequency of 1 Hz with the other input for NAND gate 93 connected to the output of NAND gate 91. With this arrangement and a logical 1 signal provided from the control signal output 36, the positive portion of each alternating signal received from the time base generator 76 causes a logical 0 signal to be presented to the circuit 94 to cause it to provide an A.C. conductive path to the output 98, while the negative portion of the signal from generator 76 causes a logical 0 signal to be presented to the circuit 96 to cause it to provide an A.C. conductive path to the output 100.

The two A.C. switching circuits 68 and 70 are identical so a description will be given only for circuit 68 identifying the various elements and their function. The circuit 68 includes a triac 61 which is optically isolated from the control signal output 38 by an optical isolator 63 which includes a light source shown as a light emitting diode (LED) 65 and a photoconductive element 47. The energization of the LED 65 is controlled by an NPN type transistor 81 which has its base electrode connected to the control signal output 36 by a resistor 83. The element 47 is connected in series with a resistor 85 and the combination is connected across the triac 61 with the connection common to the element 47 and resistor 85 connected to the gate or control electrode for triac 61. The series combination of resistor 87 and capacitor 89, which is connected across the triac 61, serves to prevent premature conduction of the triac 61.

When the control signal output 36 presents a logical 1 signal, the transistor 81 conducts to cause the LED 65 to be energized to supply light energy to the photoconductive element 47 reducing its resistance. This causes the voltage at the gate electrode of the triac to increase to a level causing the triac 61 to conduct to provide an A.C. current path from the A.C. source to the output 72. This conductive path is provided for both cycles of the A.C. voltage for so long as the control signal output presents a logical 1 signal.

The two A.C. switching circuits 94 and 96 are the same as circuits 68 and 70, except that a PNP type transistor is used to energize the LED for the circuit since the outputs 90 and 92 of the flip-flop 88 present logical 0 signals when it is desired that an A.C. conductive path be provided to the outputs 98 and 100 of the circuits 94 and 96.

Figure 4:
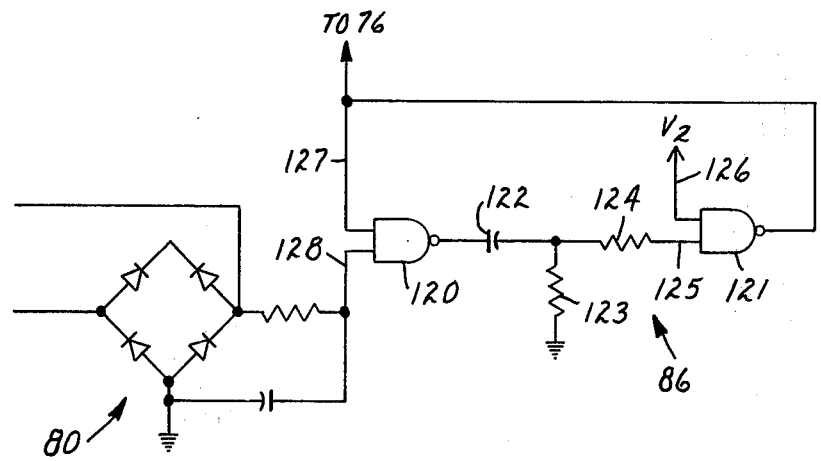
FIG. 4 is a schematic of a circuit portion of the control circuit of FIG. 1.

FIG. 4 is a schematic for a circuit that is particularly suitable as an A.C. synchronizing pulse circuit 86 for the control circuit of FIG. 1 in that it provides excellent noise immunity preventing noise signals presented via the A.C. power signal input from causing false synchronizing pulses to be presented to time base generator 76. If good noise signal immunity were not provided, false synchronizing signals would be produced in response to the noise signals to introduce timing errors which could become significant and require frequency resetting of the time for the control circuit, which would be unacceptable.

The circuit of FIG. 4 includes two NAND Schmitt trigger circuits 120 and 121, each having two inputs with Schmitt trigger action provided on both inputs. Circuits of this type are available from the RCA Corporation, New York, New York, under the type designation CD 4093B. The input 128 of NAND circuit 120 is connected to the rectifier portion of the transformer and rectifier circuit 80 from which it receives the full cycles of the A.C. power signals as a positive A.C. voltage with reference to the circuit ground. The details of circuit 80 are partially shown in FIG. 4. The output of NAND circuit 120 is connected to one side of a capacitor 122, which has its other side connected to ground via a resistor 123. The connection common to capacitor 122 and resistor 123 is connected via a resistor 124 to the input 125 of the NAND circuit 121, which has its other input 126 connected to the D.C. voltage $V_2$. The output of NAND circuit 121 is connected to provide the synchronizing pulses to the time base generator 76 and is also connected to input 127 of the NAND circuit 120.

Referring to the operation of the circuit of FIG. 4, the A.C. signal that is connected to the input 128 of NAND circuit 120 will reach the threshold or logical 1 level for NAND circuit 120 at a time when the A.C. signal is increasing in magnitude. This condition plus the presence of a logical 1 signal at the input 127 to NAND circuit 120 causes the output signal of NAND circuit 120 to be a logical 0 and is presented as such to NAND circuit 121 so that its output signal remains a logical 1. The A.C. signal to NAND circuit 120 continues to increase and then decreases to bring the signal at input 128 to a logical 0 level for circuit 120 causing its output signal to switch from a logical 0 to a logical 1. This logical 1 level is immediately reflected at the input 125 to NAND circuit 121 as a logical 1 causing its output signal to switch from its logical 1 level to a logical 0 level. Charging of capacitor 122 begins causing the signal at the input 125 of NAND circuit 121 to decrease. The rate of charging capacitor 122 is controlled by the values of capacitor 122 and resistor 123. The rate of which capacitor 122 is charged is selected to prevent the signal at input 125 of NAND circuit 121 from decreasing to a logical 0 level for about one-half the period of the A.C. power signal. In the case of 60 cycle A.C. power, capacitor 122 may be 0.01 microfarad and resistor 123 may be 1 megohm. Resistor 124 is then 10,000 ohms. Upon input 125 reaching a logical 0 level, the output of NAND circuit 121 switches to a logical 1 level which, with the increasing A.C. signal presenting threshold or logical 1 level for NAND circuit 120, causes the output of NAND circuit 120 to switch to a logical 0 level to initiate a repetition of the operation that has been described. The logical 1 signal provided at the output of NAND circuit 121 is used as the synchronizing signal for the time base generator 76. As described above, such synchronizing signal is provided once for each cycle of the A.C. power source.

The presence of noise signals with the A.C. power signal supplied to NAND circuit 120 merely alters the time in a cycle of the A.C. power at which the output of the NAND circuit 121 presents a logical 1. Noise signals presented before the output of NAND circuit 120 is normally returned to a logical 1 may cause the NAND circuit 120 to present a logical 1 prematurely to cause the output signal of NAND circuit 121 to change from a logical 1 to a logical 0. This only shortens the duration during which the output signal of NAND circuit 121 is a logical 1. The circuit portion used to couple the output of the NAND circuit 120 to the NAND circuit 121 is effective to maintain the input 125 of circuit 121 above the logical 1 level for about one-half the period of the A.C. power signal preventing the NAND circuit 120 from presenting a logical 0 signal during such time. This delay prevents any additional noise signals that may be present for the remainder of the A.C. cycle from influencing the operation of the circuit of FIG. 4. Accordingly, the circuit of FIG. 4 provides excellent noise immunity.

While only one embodiment of the invention has been illustrated and described herein, it is realized that modifications and changes will occur to those skilled in the art. It is, therefore, to be understood that the appended claims are intended to cover all such modifications and changes as fall within the true spirit and scope of the invention.

What is claimed is:

1. A control circuit for providing time selected outputs of A.C. power including:
   an A.C. powered D.C. voltage supply;
   a solid-state, 7-day, 24-hour clock connected to said D.C. voltage supply and operative in response to timing pulses and having time indicating outputs;

a crystal controlled time base generator connected to said A.C. powered D.C. voltage supply and connected to said clock for providing timing pulses to said clock;

means responsive to A.C. power and operatively connected to said time base generator for providing a pulse for each cycle of A.C. power to said time base generator for synchronizing the operation of said generator;

programmable control circuitry having a control signal output, said programmable control circuitry selectively connectable to said time indicating outputs for alternately providing initiating and terminating signals at said control signal output in accordance with times presented by said clock at said time indicating outputs corresponding to select connections when made between said time indicating outputs and said programmable control circuitry; and a solid-state A.C. power switching means having a control input, an A.C. power input and an A.C. power output, said control input connected to said control signal output of said programmable control circuitry, said switching means providing a conductive path for A.C. power from said A.C. power input to said A.C. power output in accordance with said initiating and terminating signals provided at said control signal output of said programmable control circuitry.

2. A control circuit in accordance with claim 1 wherein said means for providing a pulse for each cycle of A.C. power includes first and second NAND circuits, said first NAND circuit having one input connected to the output of said second NAND circuit and another input operatively connected for receiving an A.C. signal from said A.C. powered D.C. voltage supply; said second NAND circuit having a first input connected to a D.C. voltage provided by said A.C. powered D.C. voltage supply and having a second input; a coupling circuit operatively coupling the output of said first NAND circuit to said second input of said second NAND circuit, said coupling circuit transferring a logical 1 signal when provided at the output of said first NAND circuit to said second NAND circuit and maintaining said logical 1 signal at said second NAND circuit for about one-half the period of a cycle of said A.C. signal.

3. A control circuit in accordance with claim 1 including a standy-by battery operatively connected to said D.C. voltage power supply for providing D.C. power to said time base generator and said clock when A.C. power to said A.C. powered D.C. voltage supply is interrupted.

4. A control circuit in accordance with claim 1 wherein said programmable control circuitry includes a second control signal output for providing an initiating signal when said first-mentioned control signal output provides a terminating signal and providing a terminating signal when said first-mentioned control signal output provides an initiating signal; said control circuit further including a second solid-state A.C. power switching means having a control input, an A.C. power input and an A.C. power output, said second switching means connected to said second control signal output for providing a conductive path for A.C. power from its A.C. power input to its A.C. power output in accordance with the initiating and terminating signals provided at said second control signal output.

5. A control circuit in accordance with claim 1 wherein said programmable control circuitry includes a memory circuit portion to which said control signal output is connected for maintaining said initiating and terminating signals established at said control signal output in accordance with a time presented by said clock corresponding to a time selection connection made between said time indicating outputs of said clock and said programmable control circuitry until said time indicating outputs of said clock present the time for another time selection connection for changing said initiating and terminating signals at said control signal output.

6. A control circuit in accordance with claim 1 wherein said time base generator provides alternating signals, said control circuit further includes a circuit portion having an output, a first input connected to said control signal output and a second input connected to said time base generator for receiving said alternating signals from said generator; and a second solid-state A.C. power switching means having a control input, an A.C. power input and an A.C. power output, said control input of said second switching means connected to the output of said circuit portion, said second switching means providing a conductive path for A.C. power from said A.C. power input and A.C. power output of said second switching means in accordance with the output of said circuit portion as determined by said control signal output and said alternating signals from said time base generator.

7. A control circuit in accordance with claim 1 wherein said programmable circuitry includes at least one gate for connection to a selected initiating time provided at said time indicating outputs and operatively connected to said control signal output and at least one gate for connection to a selected terminating time provided at said time indicating outputs and operatively connected to said control signal output.

8. A control circuit in accordance with claim 1 wherein said clock also provides day of week indicating outputs, said programmable control circuitry selectively connectable to said day of week indicating outputs for providing said initiating and terminating signals at said control signal output during those day of week indicating outputs which are selectively connected to said programmable control circuitry.

9. A timing circuit including:

an A.C. powered D.C. voltage power supply;

a crystal controlled time base generator connected to said A.C. powered and D.C. voltage power supply for providing time pulses at the frequency of one cycle per second;

means responsive to A.C. power and operatively connected to said time base generator for providing a pulse for each cycle of A.C. power to said time base generator for synchronizing the operation of said generator including first and second NAND circuits, said first NAND circuit having one input connected to the output of said second NAND circuit and another input operatively connected for receiving an A.C. signal from said A.C. powered D.C. voltage power supply; said second NAND circuit having a first input connected to a D.C. voltage provided by said A.C. powered D.C. voltage power supply and having a second input; a coupling circuit operatively coupling the output of said first NAND circuit to said second input of said second NAND circuit, said coupling circuit transferring a logical 1 signal when provided at the output of said first NAND circuit to said second NAND circuit and maintaining said logical 1 signal at said second NAND circuit for about one-half the period of a cycle of said A.C. signal; and a stand-by battery operatively connected to said A.C. powered D.C. voltage power supply for providing D.C. power to said time base generator when A.C. power to said A.C. powered D.C. voltage power supply is interrupted.

* * * * *